United States Patent [19]
Seike et al.

[11] Patent Number: 5,202,629
[45] Date of Patent: Apr. 13, 1993

[54] OPTICAL MAGNETIC-FIELD SENSOR HAVING AN INTEGRALLY BONDED MAGNETOOPTICAL ELEMENT, POLARIZER, ANALYZER AND SUBSTRATE

[75] Inventors: Shoji Seike, Nagoya; Masanobu Yamamoto, Handa; Hisakazu Okajima, Nishikasugai, all of Japan

[73] Assignee: NGK Insulators, Ltd., Japan

[21] Appl. No.: 727,092

[22] Filed: Jul. 9, 1991

[30] Foreign Application Priority Data

Jul. 19, 1990 [JP] Japan .................................. 2-189450

[51] Int. Cl.⁵ .................... G01R 33/032; G01R 31/02; G02F 1/09
[52] U.S. Cl. ............................ 324/244.1; 250/227.21; 324/260; 324/96
[58] Field of Search ....................... 324/244.1, 260, 96; 359/280–284; 250/227.21

[56] References Cited

U.S. PATENT DOCUMENTS

| | | | |
|---|---|---|---|
| 4,449,096 | 5/1984 | Doriath et al. ................... | 324/244.1 |
| 4,507,787 | 3/1985 | Daly et al. . | |
| 4,823,083 | 4/1989 | Meunier et al. ................... | 324/244.1 |
| 4,962,990 | 10/1990 | Matsuzawa et al. .............. | 324/244.1 |

FOREIGN PATENT DOCUMENTS

| | | |
|---|---|---|
| 0137716 | 4/1985 | European Pat. Off. . |
| 0239351 | 9/1987 | European Pat. Off. . |
| 0345759 | 12/1989 | European Pat. Off. . |
| 0353057 | 1/1990 | European Pat. Off. . |
| 0205379 | 10/1985 | Japan ................................ 324/244.1 |
| 63-47723 | 2/1988 | Japan . |
| 63-210911 | 9/1988 | Japan . |
| 0127984 | 5/1989 | Japan ................................ 324/244.1 |

Primary Examiner—Gerard R. Strecker
Attorney, Agent, or Firm—Parkhurst, Wendel & Rossi

[57] ABSTRACT

An excellent optical magnetic-field sensor having a magnetooptical element, a polarizer, an analyzer and a substrate is provided which can decrease light loss as well as temperature dependency of the modulation rate and prevent displacement and detachment of the magnetooptical element from the polarizer and the analyzer, wherein a synthetic resin adhesive agent is filled in a space between the magnetooptical element and the polarizer and in a space between the magnetooptical element and the analyzer, and the magnetooptical element, the polarizer and the analyzer are respectively adhered or bonded to the substrate.

3 Claims, 1 Drawing Sheet

FIG_1
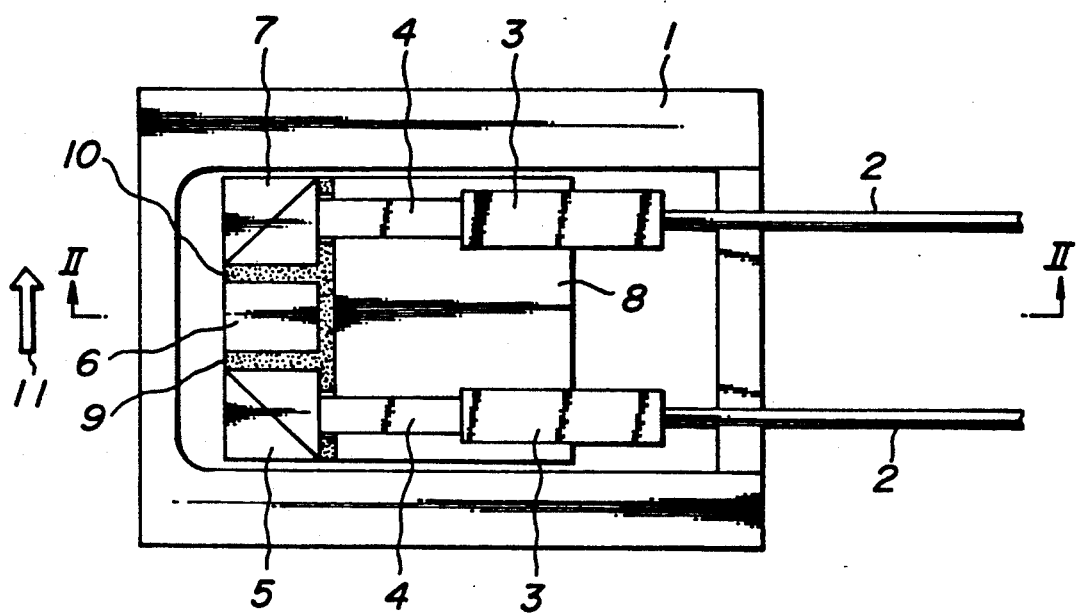
FIG_2
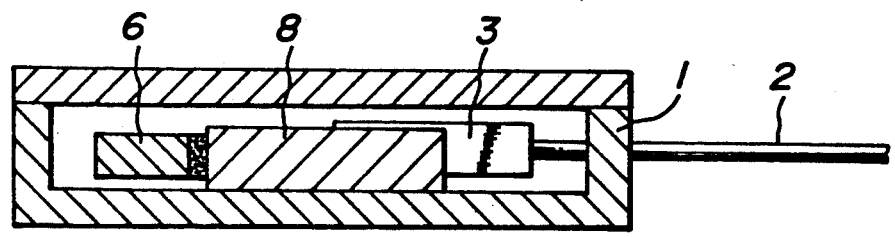

OPTICAL MAGNETIC-FIELD SENSOR HAVING AN INTEGRALLY BONDED MAGNETOOPTICAL ELEMENT, POLARIZER, ANALYZER AND SUBSTRATE

BACKGROUND OF THE INVENTION

1. Field of the Invention

The present invention relates to optical magnetic-field sensors mainly used for forming a fault point-detecting system in electric power supply line networks, electric power distribution line networks, and transformer stations.

2. Related Art Statement

Recently, in order to automatically detect fault points in electric power supply systems, optical magnetic-field sensors using optical single crystals, for example, BSO, etc., have been used wherein a light beam emitted from a transmitter is transmitted through a magnetooptical element and detected by a receiver. If an electric current thereof is rapidly changed by short-circuiting or grounding, a magnitude of the electric field generated around the power supply line is changed thereby changing a polarized plane of the light beam transmitted through the magnetooptical element, so that the change is detected to judge an occurrence of a fault in the power supply line.

In optical magnetic-field sensors, a polarizer, a magnetooptical element and an analyzer are accommodated in a housing case with their optical axes aligned to each other. However, spaces between the magnetooptical element and polarizer or the analyzer result in loss of light transmitting through the optical magnetic-field sensor. Thus, heretofore, the distance between the transmitter and a detected fault point and the distance between the receiver and the detected fault point were limited.

The applicants disclosed in their Japanese patent application Laid-open No. 63-047,723 a technique of inserting an intermediate body, such as glass, etc. in the space between the magnetooptical element and the optical parts and adhering them to each other to mitigate thermal expansion thereof. In this case also, losses of the amount of the light beam at the interfaces between the intermediate body and the magnetooptical element or the optical parts were one of major problems. Large influence of temperature change over modulation rate was also a major problem.

Meanwhile, Japanese patent application Laid-open No. 63-210,911 disclosed a technique of fixing the magnetooptical element and the optical parts to a substrate via an intermediate body. However, in this case there arise problems in that a large amount of the light beam is lost, and the surface of the magnetooptical element adhered to the intermediate body tends to peel off due to thermal stress generated by temperature change a transformer station, etc, so that the magnetooptical element is displaced. Therefore, the technique has problems with respect to long term durability.

SUMMARY OF THE INVENTION

An object of the present invention is to provide an optical magnetic-field sensor which can minimize the loss light as well as the change of the modulation rate (i.e., change of the detected value of the magnetic filed) caused by thermal expansion and shrinkage of the magnetooptical element, and which can prevent displacement of the magnetooptical element.

The present invention is an optical magnetic-field sensor including at least a magnetooptical element, a polarizer, an analyzer and a substrate, wherein a synthetic resin adhesive agent is filled in a space between the magnetooptical element and the polarizer and a space between the magnetooptical element and the analyzer, and the magnetooptical element, the polarizer and the analyzer are adhered or bonded to the substrate.

BRIEF DESCRIPTION OF THE DRAWINGS

For better understanding of the present invention, reference is made to the accompanying drawings, in which FIG. 1 is a schematic view of an embodiment of the present optical magnetic-field sensor for automatically detecting a fault point; and FIG. 2 is a schematic cross-sectional view along the line II—II thereof.

The following is a description of the numerals used in the Figures:

1 ... case or casing
2 ... optical fiber rod
3 ... ferrule
4 ... rod lens
5 ... polarizer
6 ... magnetooptical element
7 ... analyzer
8 ... substrate
9, 10 ... synthetic adhesive resin layer
11 ... magnetic field

DESCRIPTION OF THE PREFERRED EMBODIMENTS

Hereinafter, the present invention will be explained in more detail with reference to examples.

EXAMPLE 1

Referring to FIGS. 1 and 2 showing an embodiment of the present optical magnetic-field sensor, the inlet portion, the device portion (i.e., sequentially arranged polarizer 5, magnetooptical element 6 and analyzer 7 having aligned optic axes; and the outlet portion are positioned pc-shaped arrangement, which may alternatively be positioned in a linear or stream line arrangement.

More precisely, in the casing 1 a substrate 8 is fixed on which an inlet and outlet side ferrule 3 and a rod lens 4 are respectively arranged, and a device portion is fixed which is composed of a polarizer 5, a magnetooptical element 6 and an analyzer 7 sequentially arranged in this order. The ferrule 3 is disposed to facilitate handling and positioning of optical fiber 2. In this embodiment, an inlet side collimator and an outlet side collimator are respectively constituted from a rod lens 4, a ferrule 3 and an optical fiber 2. However, the ferrule 3 may be omitted from the both collimators. Positioning of the magnetooptical element 6 and the respective optical parts may be performed by preliminarily providing a desired pattern, e.g., a groove or a protruded pattern, on the substrate 8.

A space between the magnetooptical element 6 and the polarizer 5 and a space between the magnetooptical element 6 and the analyzer 7 are filled respectively by an adhesive agent 9, 10 made of synthetic resin to adhere or bond them to each other. As the adhesive agent 9, 10, preferably a cold setting type, thermosetting type or ultraviolet ray setting type resin having substantially the same refraction index as those of the magnetooptical element 6, the polarizer 5 and the analyzer 7, is used. As examples of the preferable synthetic resin, epoxy series resin or acrylate series resin, etc., may be mentioned.

The magnetooptical element 6, the polarizer 5 and the analyzer 7 are adhered to the substrate 8 by means of an adhesive agent.

Preferably, the adhesive agent made 9, 10 of a synthetic resin is filled into the spaces to a thickness of 0.001–0.5 mm.

In the optical magnetic-field sensor as shown in FIG. 1, an incident light beam (from a light source not shown optically connected to optical fiber 2) emanated from the rod lens 4 is passed through the polarizer 5 to assume a linear polarized light beam, and passed through the magnetooptical element 6 to receive Faraday's rotation. The rotated light beam is passed through the analyzer 7 wherein the amount of light is changed depending on the Faraday's rotation thereof. The amount of light corresponds to the magnetic field 11 acting on the magnetooptical element 6.

According to the optical magnetic-field sensor of this embodiment, the space between the magnetooptical element 6 and the polarizer 5 and the space between the magnetooptical element 6 and the analyzer 7 are respectively filled with an adhesive agent 9, 10 made of a synthetic resin, so that the loss of the light beam at the spaces can be decreased. In addition, the magnetooptical element 6 is adhered to the polarizer 5, the magnetooptical element 6 is adhered to the analyzer 7, and the magnetooptical element 6, the polarizer 5 and the analyzer 7 are respectively adhered to the substrate 8, and hence the magnetooptical element 6 is made integral with the adjoining optical parts, namely, the polarizer 5 and the analyzer 7, so that the optical magnetic-field sensor is highly resistant to temperature change and dislocation of the magnetooptical element 6 therefrom can be prevented for a long use thereof.

EXAMPLE 2 AND COMPARATIVE EXAMPLES 1-2

In this example, more concrete experimental embodiments will be explained.

In the arrangement of FIG. 1, a polarizer beam splitter as the polarizer 5, and the analyzer 7, a ceramic material (e.g. alumina) as the substrate 8, and a thermosetting type epoxy series adhesive agent as the adhesive agent 9, 10, are used. In order to adhere the magnetooptical element 6, the polarizer 5 and the analyzer 7 to the substrate 8, a thermosetting type epoxy series adhesive agent is also used. The thermosetting type epoxy series adhesive agent is preliminarily defoamed by evacuating in vacuo, and applied on the both end surfaces of the magnetooptical element 6 to a desired amount of usually 0.005–2.5 mg/mm$^2$, and in this embodiment 0.05 mg/mm$^2$, by a dispenser.

Next, the polarizer 5 and the detector 7 are adhered on the both end surfaces of the magnetooptical element 6, and simultaneously the polarizer 5, the analyzer 7 and the magnetooptical element 6 are adhered to the substrate 8 by a thermosetting type epoxy series adhesive agent. The magnetooptical element 6 having the adhered polarizer 5 and the analyzer 7 at opposite sides are squeezed at a pressure of 1.5 g/mm$^2$ by a pressing jig to make the thickness of the thermosetting type epoxy resin series adhesive agent 9, 10 a constant thickness of 10 μm. The magnetooptical element 6, the polarizer 5 and the analyzer 7 are adhered and pressed on the substrate 8 with the pressing jig and are put in a dryer and thermoset or cured at a curing condition of 82° C. for 90 min. The polarizer 5 and the analyzer 7 in FIG. 1 have usually horizontal thicknesses of 3–7 mm and lateral widths of 3–7 mm, and the magnetooptical element 6 in FIG. 1 has usually a horizontal thickness of 3–4 mm. In this way, an optical magnetic-field sensor of this example is obtained.

Comparative Example 1 is an optical magnetic-field sensor prepared according to JP-A-63-047-723, wherein in space between the magnetooptical element 6 and the polarizer 5 and in the space between the magnetooptical element 6 and the analyzer 7 are disposed optical glass of a thickness of 0.1 mm and adhered and fixed by an adhesive. The polarizer 5 and the analyzer 7 are adhered to their respective rod lens 4 by means of an adhesive agent.

For preparing Comparative Example 2, an optical magnetic-field sensor is prepared according to the method disclosed in JP-A-63-210-911 magnetooptical element 6, the polarizer 5 and the analyzer 7 are individually adhered to the substrate 8 by means of an adhesive agent, and the space between the magnetooptical element 6 and the polarizer 5 and the space between the magnetooptical element 6 and the analyzer 7 are not filled by optical glass or the adhesive agent 9, 10.

These three optical magnetic-field sensors are measured on loss of light, temperature dependency of the modulation rate, and the state of the magnetooptical element used for a long period, by the following measuring methods.

Loss of light;

A LED light beam is made incident via the incident side end of the optical fiber 2 and an amount of light beam exited from the exit side end of the optical fiber 2 is measured.

Temperature dependency of modulation rate;

Each optical magnetic-field sensor is applied with an alternating magnetic field of 50 Hz and 100 Oe, put in an isotherm tank, and subjected to three-cycles of a heat-cooling cycle of heating to 80° C. and cooling to −20° C. for 8 hours to measure the temperature dependency of the modulation rate in a temperature range of −20° C. - +80° C. The result is expressed as a change relative to the output at 25° C. by the following formula.

$$\frac{\text{Output(at 80° C.)} - \text{Output(at 25° C.)}}{\text{Output(at 25° C.)}} \times 100 \, (\%)(+)$$

$$\frac{\text{Output(at −20° C.)} - \text{Output(at 25° C.)}}{\text{Output(at 25° C.)}} \times 100 \, (\%)(-)$$

wherein the output is detected as a voltage by a light-/voltage converter.

State of the magnetooptical element 6 used for a long period;

A heat-cooling cycle of heating to 80° C. and cooling to −20° C. in 30 min. of each sensor is repeated for 1,700 cycles, then each sensor is applied with an alternating magnetic field of 50 Hz and 100 Oe at 25° C. to measure a change of the modulation rate due to displacement of the magnetooptical element 6. In addition, the package of the sensor is disassembled to observe the displacement of the magnetooptical element 6.

Each experiment is conducted for 10 test samples and an average value thereof is used. Change of modulation rate used for a long period (Deviation from initial value) is expressed by a formula:

$$\frac{\text{Output(at 1700 cycle, 25° C.)} - \text{Output(at initial state, 25° C.)}}{\text{Output(at initial state, 25° C.)}} \times 100$$

wherein the initial state means non-heated and non-cooled state.

The measured results are shown in the following Table 1.

TABLE 1

|  | Loss of light (dB) | Temperature dependency of modulation rate (%) | State of magnetooptical element used for a long time | |
|---|---|---|---|---|
|  |  |  | Change of modultion rate from initial value (%) | Displacement of magnetooptical element, polarizer and analyzer |
| Example 2 | −9 | +1.0 | ±0.6 | none |
| Comparative Example 1 | −10 | ±2.4 | ±5.0 | yes |
| Comparative Example 2 | −11 | ±1.5 | ±1.2* | A9 |

*Average value of the remaining 6 samples

According to the optical magnetic-field sensor of the present invention, the spaces between the magnetooptical element and the polarizer and between the magnetooptical element and the analyzer are filled by an adhesive synthetic resin agent, so that the loss of light at the spaces can be decreased.

Also, the magnetooptical element, the polarizer and the analyzer are respectively adhered to the substrate, and hence the magnetooptical element as well as the polarizer and the analyzer are integrally adhered to the substrate, so that temperature dependency of the modulation rate of the sensor can be mitigated, and displacement and detachment of the magnetooptical element from the polarizer and the analyzer can be prevented.

Although the present invention has been explained with reference to specific values and embodiments, it will of course be apparent to those skilled in the art that the present invention is not limited thereto and many variations and modifications are possible without departing from the broad aspect and scope of the present invention as defined in the appended claims.

What is claimed is:

1. An optical magnetic-field sensor of a fault point detecting system, comprising:
   a magnetooptical element;
   an analyzer and a polarizer disposed on opposite sides of said magnetooptical element such that the optical axis of said analyzer, said polarizer and said magnetooptical element are aligned, said analyzer, said polarizer and said magnetooptical element being bonded together with synthetic resin disposed in spaces between said magnetooptical element and said analyzer, and between said magnetooptical element and said polarizer;
   a substrate, wherein said analyzer, said polarizer and said magnetooptical element are disposed along and bonded to a side surface of said substrate with synthetic resin such that said analyzer, said polarizer, said magnetooptical element and said substrate form an integral structure;
   a first rod lens and a first ferrule positioned on and fixed to a top surface of said substrate to pass light into said polarizer, and a second rod lens and a second ferrule positioned on and fixed to said top surface of said substrate to receive light from said analyzer, wherein said substrate has a predetermined pattern along said top surface for positioning and receiving said first and second rod lenses and said first and second ferrules; and
   a protective casing for housing said integral structure such that said substrate is fixed to said casing.

2. The device of claim 1, wherein said synthetic resin disposed in said spaces has a thickness of 0.001–0.5 mm.

3. The device of claim 1, wherein said predetermined pattern comprises grooves for receiving said first and second rod lenses and said first and second ferrules.

* * * * *